(12) United States Patent
Elliott et al.

(10) Patent No.: US 6,379,095 B1
(45) Date of Patent: Apr. 30, 2002

(54) ROBOT FOR HANDLING SEMICONDUCTOR WAFERS

(75) Inventors: Martin R. Elliott, Round Rock, TX (US); Jeffrey C. Hudgens, San Francisco, CA (US); Chris Pencis, Austin; Damon Cox, Bastrop, both of TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/549,777

(22) Filed: Apr. 14, 2000

(51) Int. Cl.⁷ .............................. B65H 1/60; C23C 16/00
(52) U.S. Cl. ...................................... 414/279; 118/719
(58) Field of Search ................................ 414/279, 939, 414/937, 940, 416.03, 416.08; 118/719

(56) References Cited

U.S. PATENT DOCUMENTS

| | | | | |
|---|---|---|---|---|
| 5,789,878 A | * | 8/1998 | Kroeker et al. | 318/45 X |
| 5,837,059 A | * | 11/1998 | Glants | 118/733 X |
| 5,993,141 A | * | 11/1999 | Wytman | 414/744.2 X |
| 6,102,164 A | * | 8/2000 | McClintock et al. | 187/367 X |
| 6,257,827 B1 | * | 7/2001 | Hendrickson et al. | 414/805 X |

* cited by examiner

Primary Examiner—Christopher P. Ellis
Assistant Examiner—Kenneth W Bower
(74) Attorney, Agent, or Firm—Dugan & Dugan LLP

(57) ABSTRACT

An apparatus for processing semiconductor wafers has an automatic robot for independently and simultaneously handling two wafers (W) at the same time on two separate transfer planes. The robot comprises a first arm assembly having a left and a right arm each mounted at one end for independent rotation in a first horizontal plane about a center vertical axis, the other ends of the arms being movably joined together and holding a blade on which a wafer can be carried, the arms being horizontally bendable near their centers so they can be folded to retract the blade toward the center axis and rotated to a desired angular position, the arms being extendable along a radius from the center axis by moving the arms together near their centers to bring the arms nearly parallel to each other and to extend the blade from the center axis by a maximum amount; and a second arm assembly substantially identical to the first assembly and rotatable in a second horizontal plane closely spaced above the first plane, the operation of the second assembly being substantially identical to that of the first assembly but independent thereof.

12 Claims, 4 Drawing Sheets

ROBOT FOR HANDLING SEMICONDUCTOR WAFERS

FIELD OF THE INVENTION

This invention relates to an automatically controlled robot (mechanical mechanism) having substantially improved capacity for transferring semiconductor wafers between stations in processing equipment for the manufacture of semiconductors.

BACKGROUND OF THE INVENTION

In the manufacture of semiconductors, such as integrated circuits (ICs), dynamic random access memories (DRAMs), etc., large thin wafers (typically of silicon) from which the semiconductors are fabricated must frequently be transferred from one processing chamber to another. This transfer of wafers must be carried out under conditions of absolute cleanliness and often at sub-atmospheric pressures. To this end various mechanical arrangements have been devised for transferring wafers to and from processing chambers in a piece of equipment or from one piece of equipment to another.

It is the usual practice to load wafers into a cassette so that a number of them can be carried under clean-room conditions safely and efficiently from one place to another. A cassette loaded with wafers is then inserted into an input/output (I/O) chamber ("load lock" chamber) where a desired gas pressure and atmosphere can be established. The wafers are fed one-by-one to or from their respective cassettes into or out of the I/O chamber. It is desirable from the standpoint of efficiency in handling of the wafers that the I/O chamber be located in close proximity to a number of processing chambers to permit more than one wafer to be processed nearby and at the same time. To this end two or more chambers are arranged at locations on the periphery of a transfer chamber which is hermetically sealable and which communicates with both the I/O chamber and the processing chambers. Located within the transfer chamber is an automatically controlled wafer handling mechanism, or robot, which takes wafers supplied from the I/O chamber and then transfers each wafer into a selected processing chamber. After processing in one chamber a wafer is withdrawn from it by the robot and inserted into another processing chamber, or returned to the I/O chamber and ultimately a respective cassette.

Semiconductor wafers are by their nature fragile and easily chipped or scratched. Therefore they are handled with great care to prevent damage. The robot mechanism which handles a wafer holds it securely, yet without scratching a surface or chipping an edge of the brittle wafers. The robot moves the wafer smoothly without vibration or sudden stops or jerks. Vibration of the robot can cause abrasion between a robot blade holding a wafer and a surface of the wafer. The "dust" or abraded particles of the wafer caused by such vibration can in turn cause surface contamination of other wafers, an undesirable condition. As a result the design of a robot requires careful measures to insure that the movable parts of the robot operate smoothly without lost motion or play, with the requisite gentleness in holding a wafer, yet be able to move the wafer quickly and accurately between locations. Because of these complex requirements, previous robot mechanisms have been unable to handle more than one wafer at a time in the limited space provided within a reasonably sized transfer chamber. It is desirable to provide a robot able to independently handle two wafers at the same time thereby increasing the through-put of a wafer-processing apparatus. It is also desirable to be able to place such a dual-capacity robot within substantially the same size of transfer chamber as used with previous robots. This also permits ease of fitting a dual-capacity robot into wafer processing apparatus of prior design and size.

SUMMARY OF THE INVENTION

In accordance with the present invention, in one specific embodiment thereof, there is provided an improved robot for handling semiconductor wafers and having twice the wafer-moving and transfer capability of previous robots. This improved robot includes a first arm assembly having a left and a right arm each mounted at one end for independent rotation in a first horizontal plane about a center vertical axis, the other ends of the arms being movably joined together and holding a blade on which a wafer can be carried, the arms being horizontally bendable near their centers so they can be folded to retract the blade toward the center axis and rotated to a desired angular position, the arms being extendable from the center axis by moving the arms together near their centers to bring the arms toward each other and to extend the blade from the center axis by a desired amount. The robot further includes a second arm assembly substantially identical to the first assembly and rotatable in a second horizontal plane closely spaced above the first plane, the operation of the second assembly being substantially identical to that of the first assembly but independent thereof.

A better understanding of the invention together with a fuller appreciation of its many advantages will best be gained from a study of the following description given in conjunction with the accompanying drawings and claims.

The drawings are not necessarily to scale.

DETAILED DESCRIPTION

Figure 1:
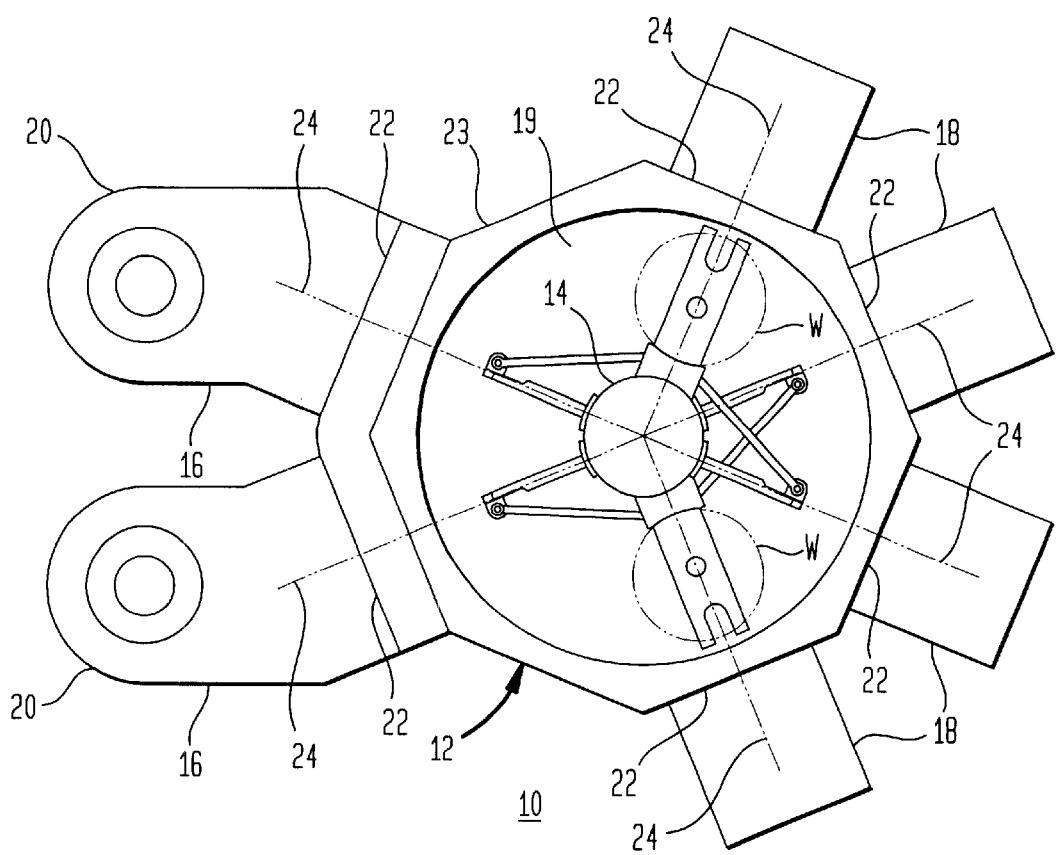
FIG. 1 is a schematic plan view partially broken away of a semiconductor wafer processing apparatus which includes a transfer chamber which houses an improved wafer-handling robot embodying features of the invention, together with an input/output (I/O) chamber and a plurality of processing chambers positioned around the periphery of the transfer chamber.

Referring now to FIG. 1, there is shown a schematic plan view, partially broken away, of a semiconductor wafer processing apparatus 10 including a transfer chamber 12, an improved wafer-handling robot 14 embodying features of the invention and contained within the transfer chamber 12, input/output (I/O) chambers 16 joined to the transfer chamber 12 at the periphery thereof, and four processing chambers 18 likewise joined to the transfer chamber 12 along its periphery. The I/O chambers 16 and the processing chambers 18 are well known in the art, as is the basic structure of the transfer chamber 12. The robot 14 is not limited to use with particular kinds and numbers of such chambers. The robot 14 by way of example is attached to a floor or bottom wall 19 of the transfer chamber 12 and is sealed around an access opening (not shown here) in the floor 19 as will be explained hereinafter. A top wall or cover which covers the transfer chamber 12 is not shown. While shown here as circular, the transfer chamber 12 in certain applications may be elliptical.

The I/O chambers 16, as illustrated here, are adapted to have attached to them respective wafer-holding cassettes 20, two of which are shown, and each of which is capable of holding a number of wafers (not shown) on closely spaced vertical levels, or shelves, within the cassette. The cassettes 20, as explained previously, provide a desirable way of carrying the wafers in clean-room condition from one piece of equipment, such as the apparatus 10, to and from another location. Within each I/O chamber 16 is a mechanism (not shown and well known in the art) for moving a selected wafer on its respective shelf in a cassette 20 to a designated level at which the robot 14 can remove the wafer from the I/O chamber 16. The robot 14 then brings the wafer into the transfer chamber 12 for subsequent insertion into a selected one of the processing chambers 20. After processing, a wafer is removed by the robot 14 from a processing chamber 18 and returned to a selected I/O chamber 16 and thence to its respective level in a cassette 20. Two wafers W, indicated in dotted outline in FIG. 1, are shown being held by the robot 14. By way of example, a wafer W can be 300 millimeters (mm) in diameter, though the invention is not limited to use with any particular diameter of wafer. The I/O chambers 16 and the transfer chamber 12 are hermetically sealed off from each other by "slit valve" slots 22, one for each cassette 20, which slots 22 are located in a peripheral wall 23 of the transfer chamber 12 and are automatically opened and closed to permit the transfer of wafers to or from the chambers. Such slit valve slots 22 are well known in the art and are not further described herein. Similar slit valve slots 22 seal the transfer chamber 12 from the respective processing chambers 18. The slit valve slots 22 are, by way of example, shown located at respective radii, indicated by dashed lines 24, in the wall 23 at the respective entrances to the I/O chambers 16 and the processing chambers 18.

Figure 2:
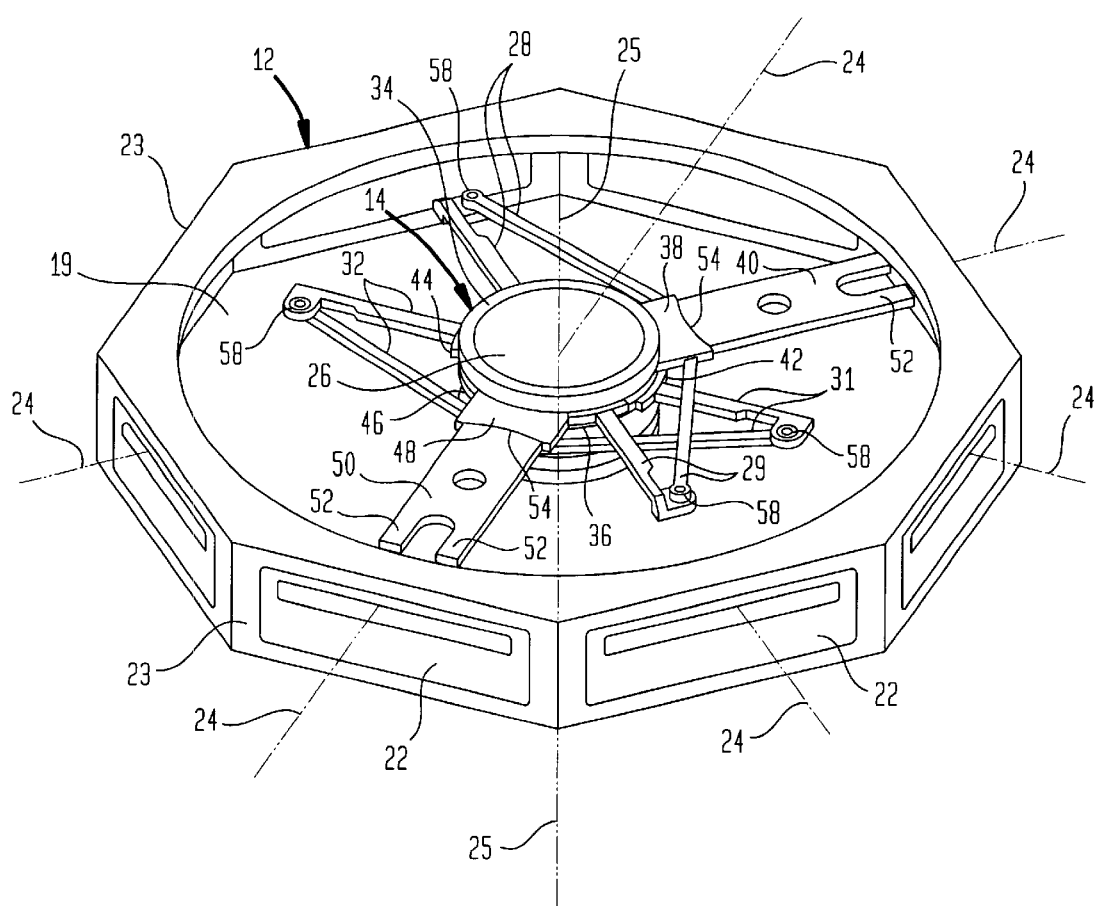
FIG. 2 is a perspective view partially broken away of a portion of the transfer chamber and of the improved robot embodying features of the invention.

Referring now to FIG. 2, there is shown partially broken away a perspective view of the transfer chamber 12 and of the robot 14 embodying features of the invention. The I/O chambers 16 and the processing chambers 18 are not shown. The robot 14 is aligned along a vertical center axis 25 and comprises a hub 26, an upper or first pair of extendable arms 28 and 29 and a lower or second pair of substantially identical arms 31 and 32 which are inverted or turned upside down relative to the first pair of arms. This permits the pairs of arms to be spaced closely together in the vertical direction in parallel, horizontal planes (see also FIG. 3). The inner ends of the upper arms 28 and 29 are rigidly fixed respectively to an upper pair of separately rotatable narrow ring-like bodies 34 and 36 (see also FIG. 3), and the outer ends of these arms 28 and 29 are geared together by a wrist mechanism 38 which supports horizontally an upper wafer-holding blade 40 and holds it radially aligned. The lower pair of extendable arms 31 and 32 similarly have inner ends fixed respectively to a second, lower pair of narrow ring-like bodies 42 and 44 which are rotatable on bearings around the hub 26 and are spaced by a narrow-diameter vertical gap, indicated at 46 (see also FIG. 3), a short distance below the upper pair of ring-like bodies 34 and 36. The outer ends of the lower arms 31 and 32 are geared together by a wrist mechanism 48 which supports horizontally a lower wafer-holding blade 50 and holds it radially aligned. The two wafer-holding blades 40 and 50 are aligned radially with the hub 26, though each blade is extendable or retractable, and also rotatable, independently of the other blade. Each blade 40 and 50 has a front lip 52 and a rear shoulder 54 which engage the rim or edge of a wafer W (see FIG. 1) and position it on a respective blade. A retractable detent or finger mechanism (not shown) at each rear shoulder 54 of each blade 40 or 50, and contained respectively within the wrist mechanism 38 or 48, automatically engages the edge of a wafer W to help hold it in place when the wafer is being moved into or out of a chamber. Each detent mechanism is automatically disengaged by its wrist mechanism 38 or 48 to free the wafer to be lifted off of, or placed onto a respective blade 40 or 50 by further mechanism (not shown) when a blade is fully inserted into a chamber 16 or 18. The upper and lower pairs of arms 28, 29 and 31, 32 are shown in FIG. 2 folded with their respective wrist mechanisms 38 and 48 partially retracted into the vertical hub gap 46, thereby minimizing the inside diameter necessary for the transfer chamber 12. Each of the arms 28, 29 and 31, 32 is provided near its center with a respective one of four elbow bearings 58 which permit the arms to bend easily in their respective horizontal planes to a folded position as shown, but these bearing 58 resist vertical play or up-and-down lost motion of the outer portions of the respective arms 28, 29 and 31, 32.

Figure 3:
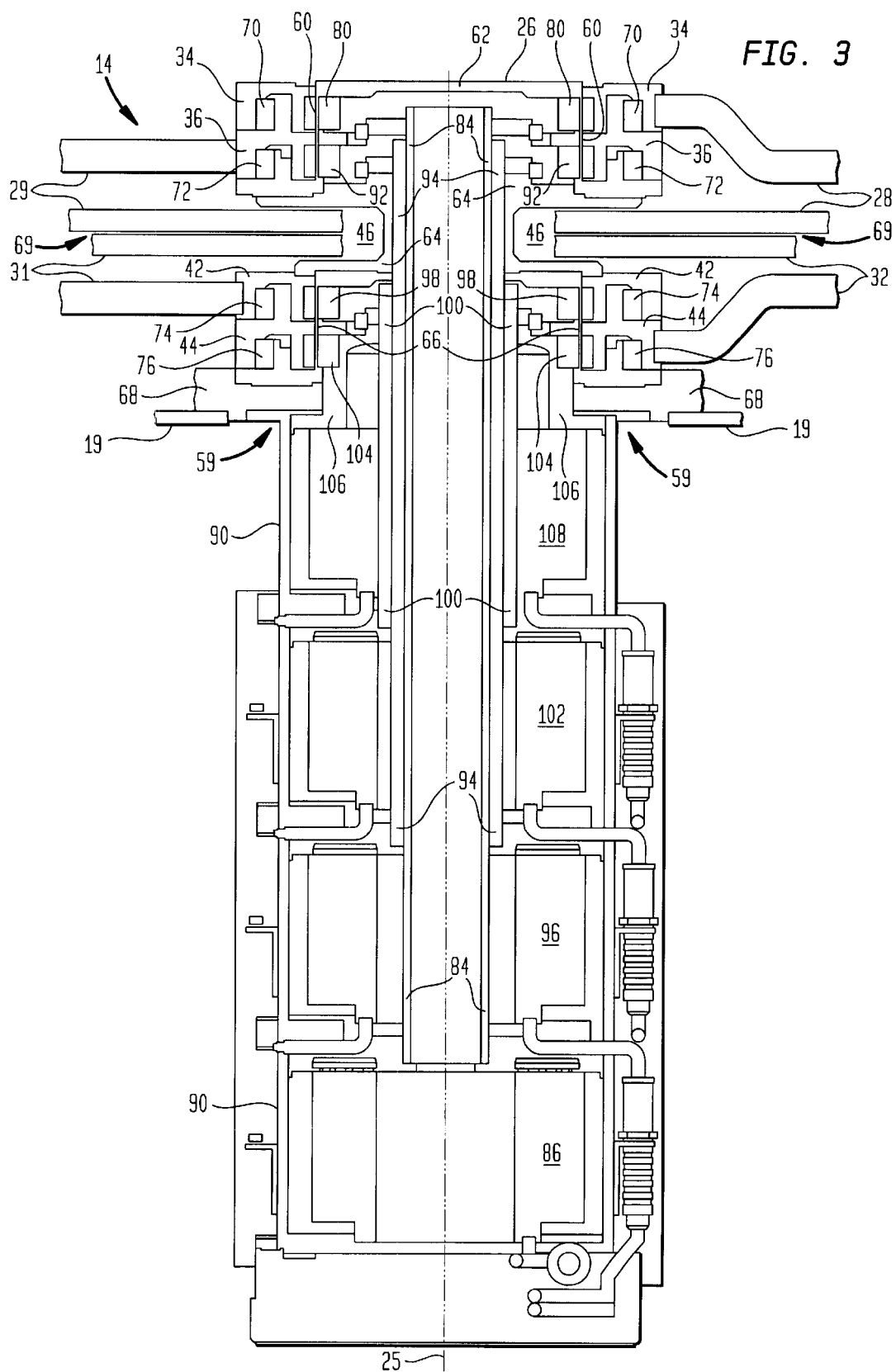
FIG. 3 is a schematic side view of the improved robot of FIG. 2 with portions broken away and other portions shown in cross-section.

The upper pair of arms 28, 29 can be extended (for example along one of the radii 24) to move its blade 40 through a selected slit valve slot 22 (and into one of the chambers 16, and 18) by rotating the ring-like bodies 34 and 36, by which the arms are supported, incrementally in opposite directions relative to each other and by the same amount (see also FIG. 3). Thus, rotating the body 34 counterclockwise about the axis 25 and at the same time rotating the body 36 clockwise will straighten out the arms 28 and 29 until they are nearly parallel to each other. This fully extends the wafer-holding blade 40 outward from the hub 26 along a radius 24 and through a selected slit valve slot 22. Thereafter the arms 28 and 29 by opposite action of the ring-like bodies 34, 36 are folded back to the position shown to retract the blade 40 and permit it to be rotated to a different angular position for insertion into a selected chamber 16 or 18. The wafer-holding blade 50 and the arms 31, 32 are similarly controlled by selective rotation of their respective ring-like bodies 42 and 44. Because the separate horizontal blades 40 and 50 are so closely spaced vertically, each blade (and a wafer being held by it) can easily pass horizontally without interference through any slit valve slot 22. The ordered sequencing in operations of the robot 14, and its arms 28, 29 and 31, 32 and the slit valve slot 22 is controlled by a computer (not shown) and is well known in the art.

Referring now to FIG. 3, there is shown a schematic side view of the robot 14, provided according to the invention, with portions broken away, other portions in cross-section, and still other portions schematically shown. The bottom of the hub 26 of the robot 14 is sealed around a circular access opening, indicated at 59, in the floor 19 of the transfer chamber 12 (not otherwise shown here). The hub 26 near its top has first a thin, cylindrical vertical wall 60 of non-magnetic material such as aluminum, on top of which is fixed a sealing plate 62. The bottom end of the thin wall 60 is fixed (and sealed to) an annular member 64 which forms the hub gap 46 (see also FIG. 2). The bottom end of the annular member 64 is sealed to the upper end of a second, thin cylindrical vertical wall 66 (also non-magnetic), axially aligned with the first wall 60. The lower end of the second wall 66 is fixed and sealed to an annular disc 68 which in turn is sealed to the chamber floor 19 around the opening 58.

The upper arms 28, 29 and the lower arms 31, 32 (shown partially broken away in FIG. 3) are substantially identical but are inverted relative to each other. These arms along their outer portions have horizontal flat surfaces which as shown in FIG. 3 face each other and are separated by a small vertical space indicated at 69. This close spacing 69 permits the arms (and their respective wrists 38 and 48) to partially recess in the hub gap 46 (see also FIG. 2). The wafer-holding blades 40 and 50 (not shown in FIG. 3) are also close enough together, with respect to the vertical direction, that both of these blades easily fit through the slit valve slot 22 (see FIG. 2), as was mentioned previously.

The topmost rotatable ring-like body 34, to which is fixed the arm 28 (see also FIG. 2), is rotatably supported on the hub 26 by a bearing assembly 70 which in turn is supported by an upper portion of the ring-like body 36 (to which the arm 29 is attached). The body 36 is rotatably supported by a bearing assembly 72 in turn supported by a fixed portion of the hub 26 just above the annular member 64. The ring-like bodies 34 and 36 are thus able to rotate independently and opposite of each other, or in unison together, as was described previously. The two lower ring-like bodies 42 and 44 (attached to the arms 31, 32) are rotatably supported in a substantially identical way by a bearing assembly 74 and a bearing assembly 76, and are similarly operable.

The topmost ring-like body 34 is rotatably coupled through the thin hub wall 60 (transparent to a magnetic field) via a magnetic coupling assembly 80 to the upper end of a vertical rotatable drive shaft 84, aligned with the axis 25, and extending downward through the hub 26 and through the opening 59 in the chamber floor 19 to a first servo motor 86, The motor 86 is held within a vertical support frame 90 attached to the floor 19; a rotatable part of the motor 86 drives the shaft 84 in either direction and positions it (and the ring-like body 34) with great angular precision. The magnetic coupling assembly 80 (well known in the art) tightly couples the rotation of the shaft 84 to the ring-like body 34 so that there is no angular play or error in the rotation of the body 34. The thin wall 60, and the thin wall 66, provide an hermetic seal between the rotating members inside and outside of the hub 26. In substantially identical fashion described above with respect to the ring-like body 34, the ring-like body 36 is rotationally coupled by a magnetic coupling assembly 92 to the upper end of a shaft 94 which extends downward to a servo motor 96; the ring-like body 42 is rotationally coupled via a magnetic coupling assembly 98 to the upper end of a shaft 100 which extends downward to a servo motor 102, and the ring-like body 44 is rotationally coupled via a magnetic coupling assembly 104 to a short vertical shaft 106 which extends downward to a servo motor 108. The magnetic coupling assemblies 80, 92, 98 and 104 are substantially identical to each other. The shafts 84, 94, 100 and 106 are concentric with each other, are aligned with the axis 25, and are independently rotatable. The servo motors 86, 96, 102 and 108 are identical to each other, are independently rotatable, have hollow cores through which certain of the shafts 84, 94, 100 and 106 can pass, and are supported on the frame 90. These servo motors are commercially available. Bearings associated with the respective motors and shafts are not shown. The operation of these motors is controlled by a computer (not shown) and is well known in the art.

Figure 4:
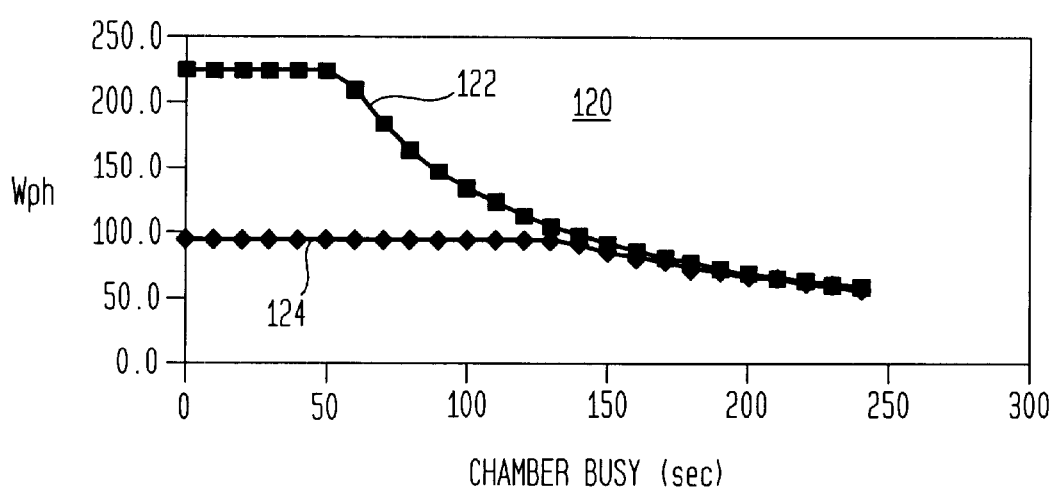
FIG. 4 is a graph showing the improvement in wafer handling capability obtained by the improved robot embodying features of the present invention compared to the capability of a prior art robot having similar operating characteristics.

Referring now to FIG. 4, there is shown a graph 120 with a vertical axis showing values of wafer throughput per hour (Wph) and a horizontal axis showing "chamber busy" time in seconds for a wafer processing apparatus having four processing chambers. The values of "Wph" are calculated using a combination of "chamber busy" times and times needed to transfer wafers between chambers. The graph 120 has a first curve 122 showing the improved productivity of an apparatus (such as the apparatus 10) utilizing an improved dual-wafer-handling robot (able to handle two wafers simultaneously such as the robot 14) provided by the invention, and a second curve 124 showing "Wph" of a similar apparatus but with a single-wafer-handling robot (able to handle only one wafer at a time). Below about 100 seconds of chamber busy time, the wafer throughput (Wph) provided by a robot embodying the invention, as indicated by the curve 122, is markedly superior to the wafer throughput of a robot without the invention, as indicated by the curve 124. And below about 50 seconds busy time, the wafer throughput provided by the invention is more than twice as great as throughput without the invention.

The above description of the invention is intended in illustration and not in limitation thereof. Various changes or modifications in the embodiment set forth may occur to those skilled in the art and may be made without departing from the spirit and scope of the invention as set forth in the accompanying claims.

What is claimed is:

1. A robot for handling wafers in semiconductor processing apparatus, the robot comprising:

a hub having at least one hub wall;

a first bearing assembly supported by the hub;

a first ring-like body rotatably supported by the first bearing assembly;

a second bearing assembly supported by the first ring-like body;

a second ring-like body rotatably supported by the second bearing assembly;

a third bearing assembly supported by the hub;

a third ring-like body rotatably supported by the third bearing assembly;

a fourth bearing assembly supported by the third ring-like body;

a fourth ring-like body rotatably supported by the fourth bearing assembly;

a first arm horizontally bendable at a central portion thereof and having a near end fixed to the first ring-shaped body;

a second arm horizontally bendable at a central portion thereof and having a near end fixed to the second ring-shaped body, the first and second arms having respective far ends movably joined together and supporting a first wafer-holding blade;

a third arm horizontally bendable at a central portion thereof and having a near end fixed to the third ring-shaped body;

a fourth arm horizontally bendable at a central portion thereof and having a near end fixed to the fourth ring-shaped body, the third and fourth arms having respective far ends movably joined together and supporting a second wafer-handling blade;

a first magnetic coupling assembly magnetically coupled to the first ring-like body through the at least one hub wall;

a first servo-motor adapted to rotate the first magnetic coupling assembly;

a second magnetic coupling assembly magnetically coupled to the second ring-like body through the at least one hub wall;

a second servo-motor adapted to rotate the second magnetic coupling assembly;

a third magnetic coupling assembly magnetically coupled to the third ring-like body through the at least one hub wall;

a third servo-motor adapted to rotate the third magnetic coupling assembly;

a fourth magnetic coupling assembly magnetically coupled to the fourth ring-like body through the at least one hub wall; and a fourth servo-motor adapted to rotate the fourth magnetic coupling assembly.

2. The robot of claim 1, wherein the hub includes a vertical gap between the first ring-like body and the fourth ring-like body, and respective portions of the first, second, third and fourth arms are retractable into the vertical gap.

3. The robot of claim 1 wherein the servo-motors are supported in vertical relation on a frame below the hub, the motors being coupled to the magnetic coupling assemblies via concentric rotatable shafts.

4. The robot of claim 1, wherein the first and second arms form a first pair of arms, and the third and fourth arms form a second pair of arms, the first and second pairs of arms being substantially identical.

5. The robot of claim 4, wherein the first and second pairs of arms are inverted relative to each other.

6. Apparatus for processing semiconductor wafers, the apparatus comprising:

an hermetically sealable transfer chamber having a central vertical axis, a floor and a peripheral wall;

an input/output chamber and a plurality of processing chambers spaced angularly at respective radii from the axis around the peripheral wall of the transfer chamber;

a plurality of slit valve slots positioned respectively on the spaced radii between the transfer chamber, I/O chamber and processing chambers to provide hermetic sealing of the respective chambers;

a hub aligned along the vertical axis of the transfer chamber and fastened to the floor thereof, the hub having at least one hub wall;

a first bearing assembly supported by the hub;

a first ring-like body rotatably supported by the first bearing assembly;

a second bearing assembly supported by the first ring-like body;

a second ring-like body rotatably supported by the second bearing assembly;

a third bearing assembly supported by the hub;

a third ring-like body rotatably supported by the third bearing assembly;

a fourth bearing assembly supported by the third ring-like body;

a fourth ring-like body rotatably supported by the fourth bearing assembly;

a first arm horizontally bendable at a central portion thereof and having a near end fixed to the first ring-shaped body;

a second arm horizontally bendable at a central portion thereof and having a near end fixed to the second ring-shaped body, the first and second arms having respective far ends movably joined together and supporting a first wafer-holding blade;

a third arm horizontally bendable at a central portion thereof and having a near end fixed to the third ring-shaped body;

a fourth arm horizontally bendable at a central portion thereof and having a near end fixed to the fourth ring-shaped body, the third and fourth arms having respective far ends movably joined together and supporting a second wafer-handling blade;

a first magnetic coupling assembly magnetically coupled to the first ring-like body through the at least one hub wall;

a first servo-motor adapted to rotate the first magnetic coupling assembly;

a second magnetic coupling assembly magnetically coupled to the second ring-like body through the at least one hub wall;

a second servo-motor adapted to rotate the second magnetic coupling assembly;

a third magnetic coupling assembly magnetically coupled to the third ring-like body through the at least one hub wall;

a third servo-motor adapted to rotate the third magnetic coupling assembly;

a fourth magnetic coupling assembly magnetically coupled to the fourth ring-like body through the at least one hub wall; and a fourth servo-motor adapted to rotate the fourth magnetic coupling assembly.

7. The apparatus of claim 6, wherein the first and second wafer-holding blades are positioned in respective horizontal planes such that the first and second wafer-holding blades can pass through the slit valve slots.

8. The apparatus of claim 6, wherein the hub includes a vertical gap between the first ring-like body and the fourth ring-like body, and respective portions of the first, second, third and fourth arms are retractable into the vertical gap.

9. The apparatus of claim 6, wherein the servo-motors are supported in vertical relation on a frame below the hub and vertically aligned with the hub and center axis, the motors being coupled to the magnetic coupling assemblies via concentric rotatable shafts.

10. The apparatus of claim 6, wherein the first and second arms form a first pair of arms, and the third and fourth arms form a second pair of arms, the first and second pairs of arms being substantially identical.

11. The apparatus of claim 10, wherein the first and second pairs of arms are inverted relative to each other.

12. The apparatus of claim 6, wherein each of the first, second, third and fourth arms has a respective elbow bearing which permits the arm to bend horizontally but not vertically.

* * * * *